US011024670B1

(12) United States Patent
Reznicek et al.

(10) Patent No.: US 11,024,670 B1
(45) Date of Patent: Jun. 1, 2021

(54) FORMING AN MRAM DEVICE OVER A TRANSISTOR

(71) Applicant: International Business Machines Corporation, Armonk, NY (US)

(72) Inventors: Alexander Reznicek, Troy, NY (US); Ruilong Xie, Niskayuna, NY (US); Heng Wu, Guilderland, NY (US); Lan Yu, Voorheesville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/695,601

(22) Filed: Nov. 26, 2019

(51) Int. Cl.
*G11C 11/00* (2006.01)
*H01L 27/22* (2006.01)
*H01L 43/12* (2006.01)

(52) U.S. Cl.
CPC ............ *H01L 27/228* (2013.01); *H01L 43/12* (2013.01)

(58) Field of Classification Search
CPC .............................. H01L 27/228; H01L 43/12
See application file for complete search history.

(56) References Cited

U.S. PATENT DOCUMENTS

| | | | |
|---|---|---|---|
| 6,879,516 B2 | 4/2005 | Nejad et al. | |
| 7,002,825 B2 | 2/2006 | Scheuerlein | |
| 8,183,061 B2 | 5/2012 | Zhong et al. | |
| 8,456,883 B1 | 6/2013 | Liu | |
| 8,674,465 B2 | 3/2014 | Li et al. | |
| 8,772,051 B1 | 7/2014 | Zhong et al. | |
| 9,450,179 B2 | 9/2016 | DeBrosse et al. | |
| 9,954,030 B2 * | 4/2018 | Lee | H01L 43/10 |
| 10,128,309 B2 * | 11/2018 | Tahmasebi | G11C 11/161 |
| 10,243,020 B1 | 3/2019 | Clevenger et al. | |
| 10,651,235 B1 * | 5/2020 | Wu | H01L 27/228 |
| 2004/0108561 A1 | 6/2004 | Jeong | |
| 2005/0087785 A1 * | 4/2005 | Lu | G11C 11/16 257/295 |
| 2019/0027535 A1 | 1/2019 | Kumar et al. | |

FOREIGN PATENT DOCUMENTS

WO 2013103516 A1 7/2013

OTHER PUBLICATIONS

Cai, et al., "MRAM-on-FDSOI Integration: A Bit-Cell Perspective," IEEE Computer Society Annual Symposium on VLSI (ISVLSI), 2018, pp. 263-268.

* cited by examiner

*Primary Examiner* — Pho M Luu
(74) *Attorney, Agent, or Firm* — Alexander G. Jochym

(57) ABSTRACT

An approach to provide a magnetoresistive random-access memory (MRAM) device that includes a first source/drain contact in a transistor in a semiconductor substrate where the source/drain contact is over a source/drain in the transistor and is surrounded by a first dielectric material. The MRAM device includes a portion of the first source/drain contact connecting to a portion of a bottom electrode of an MRAM device. Furthermore; the MRAM device includes a portion of a top electrode in the MRAM device connecting to a via, wherein the via connects to a M1 metal layer of a semiconductor chip.

20 Claims, 11 Drawing Sheets

US 11,024,670 B1

FORMING AN MRAM DEVICE OVER A TRANSISTOR

BACKGROUND OF THE INVENTION

The present invention relates generally to the field of semiconductor memory device technology and more particularly to magnetoresistive random-access memory devices.

Magnetoresistive Random Access Memory (MRAM), based on the integration of silicon based complementary silicon-oxide semiconductor (CMOS) with magnetic tunnel junction (MTJ) technology, is now a proven non-volatile memory technology with many advantages in terms of writing/read speed, power consumption, and lifetime over other commercialized memory types including SRAM, DRAM, Flash, etc. Conventional MRAM devices include a magnetic tunnel junction (MTJ) structure having magnetic (e.g., ferromagnetic) layers separated by an intermediary non-magnetic tunnel barrier layer. Digital information can be stored in the memory element and can be represented by directions of magnetization vectors. In response to voltage applied to the MTJ, the magnetic memory element exhibits different resistance values and allows an MRAM device to provide information stored in the magnetic memory element. Conventional MRAM devices are fabricated with a field effect transistor (FET) based configuration. In such configuration, each MRAM cell includes an MTJ formed over a conductive metal strap that connects the bottom of the MTJ to an access transistor locating the MRAM devices at or above the M2 or M3 metal level.

SUMMARY

Embodiments of the present invention provide a structure of a magnetoresistive random-access memory (MRAM) device that includes a first source/drain contact in a transistor in a semiconductor substrate where the source/drain contact is over a source/drain in the transistor and is surrounded by a first dielectric material. The structure includes a portion of the first source/drain contact connecting to a portion of a bottom electrode of an MRAM device. Furthermore, the structure includes a portion of a top electrode in the MRAM device connecting to a via, wherein the via connects to a M1 metal layer of a semiconductor chip.

Embodiments of the present invention provide a method of forming a magnetoresistive random-access memory (MRAM) device where the method includes depositing a dielectric layer over a top surface of a transistor after a chemical-mechanical polish of the top surface of the transistor. The method includes depositing a plurality of material layers forming an MRAM material stack over the dielectric layer and removing a portion of the MRAM stack to form an MRAM pillar. Additionally, the method includes removing an exposed portion of the dielectric layer. Furthermore, the method includes removing a portion of the dielectric layer under a portion of the MRAM pillar to form a notch under the portion of the MRAM pillar. The removed portion of the dielectric layer under a portion of the MRAM pillar is above a first source/drain contact. The method includes depositing an electrode metal over exposed surfaces of the transistor, over the MRAM pillar, and in the notch under the portion of the MRAM pillar and then, removing the electrode metal from the exposed surfaces of the transistor and from the MRAM pillar. The electrode metal in the notch forms a bottom electrode under the portion of the MRAM pillar forming the MRAM device, where the bottom electrode is above the first source/drain contact.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
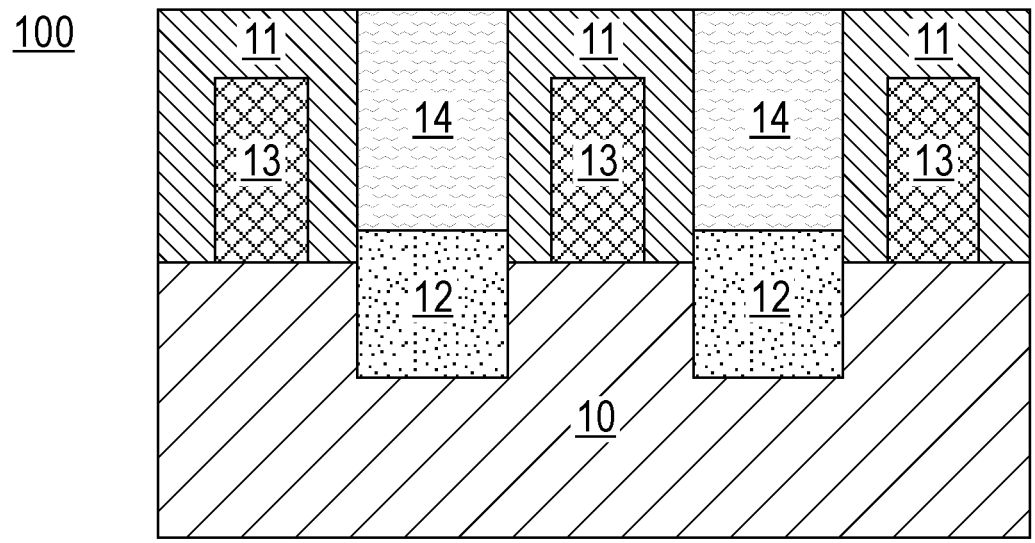
FIG. 1 is a cross-sectional view of a semiconductor structure after forming a transistor in a semiconductor substrate in accordance with an embodiment of the present invention.

Embodiments of the present invention recognize that formation of Magnetoresistive Random Access Memory (MRAM) devices commonly occurs at or above the M2 or the M3 metal layer of a semiconductor chip. Embodiments of the present invention recognize that forming the MRAM device in M2 metal layer, M3 metal layer or above increases access time from the MRAM device to the transistor formed in a semiconductor substrate below middle of line interconnects that are below the M1 metal layer. Embodiments of the present invention recognize longer distances from the MRAM device to a transistor in the semiconductor chip increases access time of the MRAM device to the transistor. Embodiments of the present invention recognize that providing a method of forming an MRAM device closer or directly connected to the transistor would decrease access time to the transistor and improve semiconductor chip electrical performance.

Embodiments of the present invention recognize MRAM device formation includes a removal of portions of numerous stacked layers of MRAM materials to form MRAM pillar which will later be incorporated into the MRAM device. Embodiments of the present invention recognize that removal of a portion of the numerous stack MRAM materials deposited over a layer of a bottom electrode causes back-sputtering or re-sputtering of metal elements from the bottom electrode on sides of the MRAM pillar and surrounding elements in the semiconductor chip. Embodiments of the present invention recognize that back-sputtering of bottom electrode elements reduces MRAM device and semiconductor chip yields. Embodiments of the present invention recognized that a method of forming an MRAM pillar before forming a bottom electrode would improve semiconductor chip and MRAM device yields.

Embodiments of the present invention provide a method of forming a bottom electrode after forming an MRAM pillar for the MRAM device. Embodiments of the present invention provide a method of forming the MRAM pillar on a layer of a dielectric material residing, at least, in part, over a contact to a source/drain in a CMOS transistor. Embodiments of the present invention provide a method of forming the MRAM device on a CMOS transistor and under the M1 metal layer in the semiconductor chip. Embodiments of the present invention provide a method of replacing a contact from the transistor connecting to the M1 metal layer with an MRAM device. Embodiments of the present invention provide a method of improving MRAM device access time to the CMOS transistor by placing the MRAM directly over the CMOS transistor and under the M1 metal layer. Embodiments of the present invention form the MRAM device on a source/drain contact of a transistor thereby reducing delay caused by interconnects in middle of line connections and by any wiring in M1 or M2 metal layers between the MRAM device and the transistor.

Embodiments of the present invention provide a method of forming the MRAM pillar for the MRAM device without back-sputtering of a bottom electrode material. Embodiments of the present invention provide a method of forming a bottom electrode after MRAM pillar formation. Furthermore, embodiments of the present invention provide a method of integrating MRAM device into the middle of the line interconnects that avoids damage to gate structures and source/drains contacts.

Embodiments of the present invention provide a method of forming the MRAM pillar on the layer of dielectric material, where a portion of the layer of the dielectric material under the MRAM pillar is removed to form a bottom electrode for the MRAM device. Embodiments of the present invention provide a method of etching a portion of the layer of dielectric material under the MRAM pillar to form a divot or a notch that is filled with an electrode material to create a bottom electrode for the MRAM device.

Detailed embodiments of the claimed structures and methods are disclosed herein. The method steps described below do not form a complete process flow for manufacturing integrated circuits, such as, semiconductor devices. The present embodiments can be practiced in conjunction with the integrated circuit fabrication techniques currently used in the art, for magnetic tape heads, and only so much of the commonly practiced process steps are included as are necessary for an understanding of the described embodiments. The figures represent cross-section portions of a MRAM device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

FIG. 1 is a cross-sectional view of semiconductor structure 100 after forming a transistor in semiconductor substrate 10 in accordance with an embodiment of the present invention. Using known CMOS semiconductor processes, semiconductor structure 100 can be formed in semiconductor substrate 10 by forming source/drain (S/D) contacts 14 (e.g., a bottom silicide with metal fill on top) in a contact trench over source/drain (S/D) 12 and then, performing a chemical-mechanical polish (CMP) of a top surface of semiconductor structure 100. As depicted, FIG. 1 includes semiconductor substrate 10, S/D 12, gate stack 13, S/D contacts 14, and first dielectric layer 11. The cross-sectional view of semiconductor structure 100 is along a fin direction of a plurality of fins formed in semiconductor substrate 10. The top portion of semiconductor substrate 10 is a portion fin that runs parallel to the cross-section (e.g., the fin is parallel to a surface of the drawing sheet). As known to one skilled in the art, a combination of a portion of semiconductor substrate 10 forming a channel, such as a fin, two of S/D 12, one or more of gate stack 13, and two of S/D contacts 14 may form a transistor (e.g., MOSFET).

First dielectric layer 11 can deposited over exposed surfaces of semiconductor substrate 10, S/D 12, gate stack 13 which includes a high-k dielectric material, and S/D contacts 14. Not depicted in FIG. 1 is a gate cap spacer over gate stack 13 and a gate sidewall spacer over the gate cap. As known to one skilled in the art, first dielectric layer 11, the gate cap, and the gate sidewall may all be composed of a same dielectric material (e.g., SiN) or may be composed of different dielectric materials. First dielectric layer 11 adds a protective dielectric layer over elements of the transistor gate, such as gate stack 13 and S/D contacts 14, in order to prevent contact-to-gate shorts between S/D contacts 14 and gate stack 13. S/D 12 can be an n-doped source/drain region, such as Si doped with phosphorous, in a N-FET transistor or a p-doped source/drain region, such as boron doped SiGa in a P-FET transistor. Gate stack 13 consists of a gate dielectric (not depicted) and a gate electrode (not depicted). The gate dielectric can be SiO2, SiON, or a high-k dielectric material. The gate electrode can be any metal gate material, such as, TiN, TiC, TaN, and TiAlC that may have tungsten fill.

While FIG. 1 depicts a metal-oxide semiconductor field-effect transistor (MOSFET), such as finFET transistor, embodiments of the invention are not limited to MOSFET transistors using finFET structures. The CMOS device or transistors formed in FIG. 1 can be any CMOS device or MOSFET transistor (e.g., vertical FET, planar FET, etc.) capable of providing required functions and exchanging data with an MRAM device (e.g., the MRAM device formed in FIG. 11) in a semiconductor chip.

Figure 2:
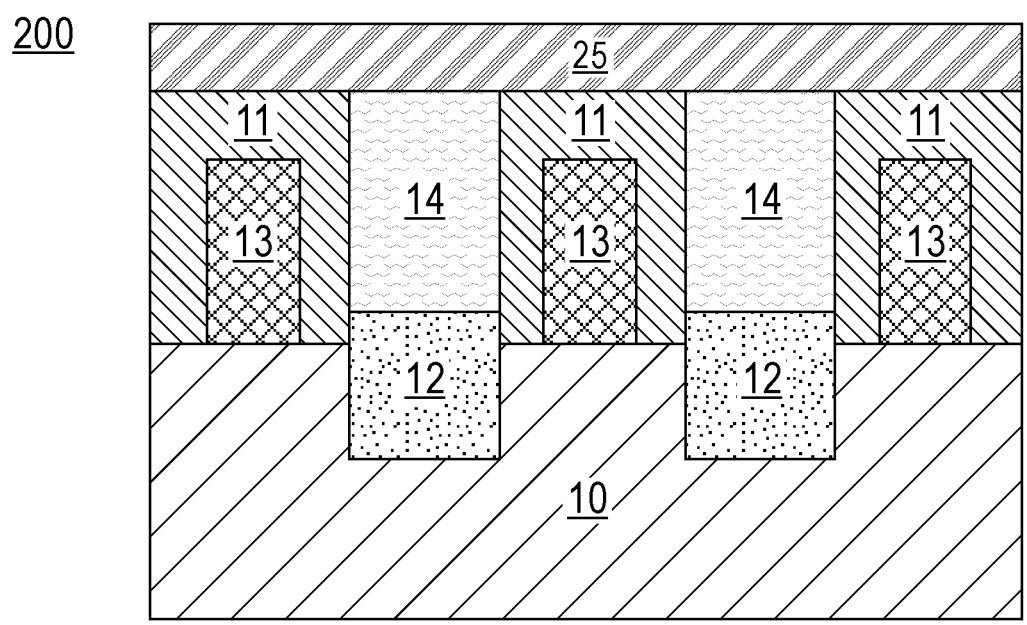
FIG. 2 is a cross-sectional view of the semiconductor structure after forming a layer of dielectric material over the semiconductor substrate in accordance with an embodiment of the present invention.

FIG. 2 is a cross-sectional view of semiconductor structure 200 after forming dielectric layer 25 over semiconductor structure 200 in accordance with an embodiment of the present invention. In various embodiments, a thin layer of dielectric material is deposited over a top surface of semiconductor structure 200 forming dielectric layer 25. The deposition can be performed using plasma enhanced chemical vapor deposition (PECVD). Dielectric layer 25 deposition is not limited to PECVD but may be done using any suitable dielectric deposition process capable of providing a dielectric layer thickness less than fifty nanometers. In various embodiments, a thickness of dielectric layer is in the range of 5 nanometers to 40 nanometers.

Dielectric layer 25 can be composed of one of SiC, SiCO, or SiOx, where SiOx. is any compound material composed of silicon with one or more oxygen atoms. In various embodiments, a thickness of dielectric layer 25 is in a range of 5 to 50 nm. For example, dielectric layer 25 may be 10 to 15 nanometer thick layer of SiC. As discussed below, a thickness of dielectric layer 25 can be important to formation of the bottom electrode of the MRAM device, which is done as a last or a later step in the MRAM device fabrication as discussed in detail with respect to FIG. 9.

Figure 3:
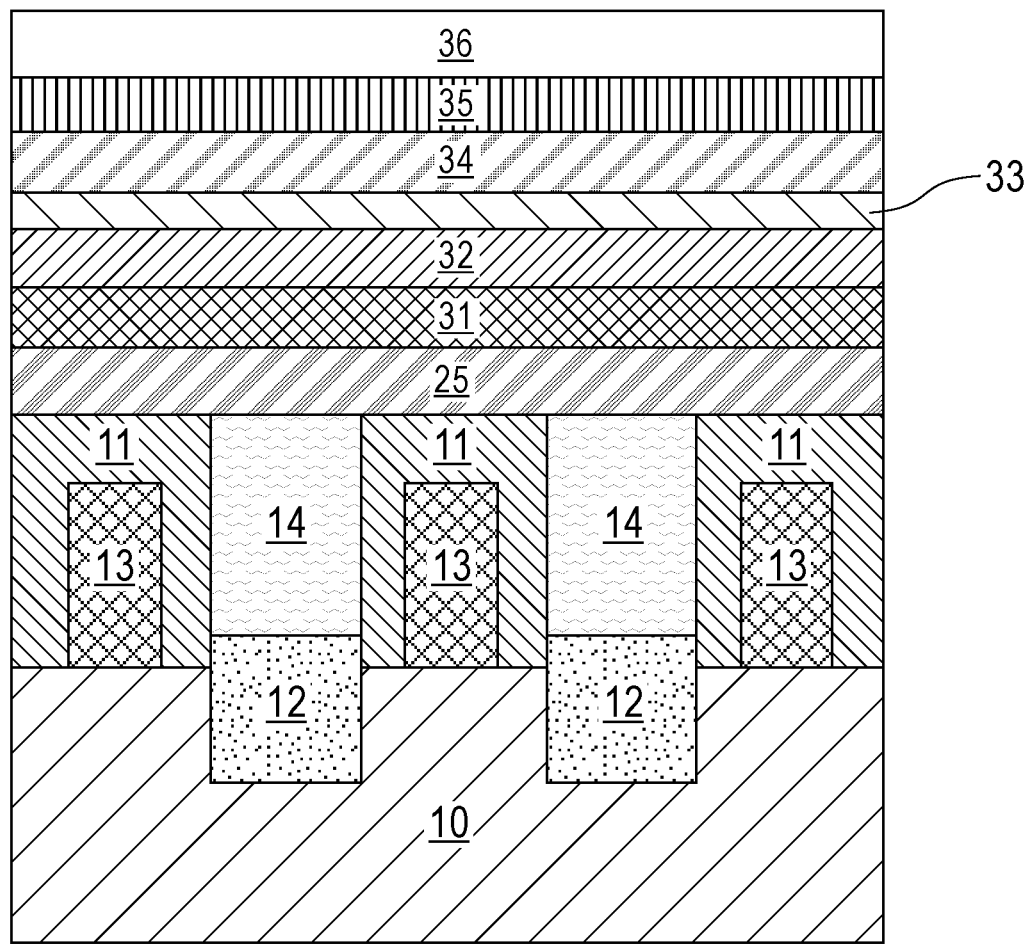
FIG. 3 is a cross-sectional view of the semiconductor structure after forming a magnetoresistive random-access stack on the layer of dielectric material in accordance with an embodiment of the present invention.

FIG. 3 is a cross-sectional view of semiconductor structure 300 after forming an MRAM material stack on dielectric layer 25 in accordance with an embodiment of the present invention. Using conventional MRAM materials and processes, a plurality of layers of materials commonly used in an MRAM device are deposited over semiconductor structure 300. As depicted, FIG. 3 includes the MRAM material stack composed of metal layer 31, reference layer 32, tunneling layer 33, free layer 34, top electrode 35, and hardmask 36, where the MRAM material stack is over dielectric layer 25 in semiconductor structure 300. For example, each layer of the MRAM material stack may have a thickness less than an angstrom to a thickness of several angstroms. Examples of typical materials in the MRAM material stack can include MgO for tunneling layer 33, TaN for hardmask 36, CoFeB for free layer 34 a plurality of layers of different materials in reference layer 32, and metal layer 31 can be a metal seed layer composed of Ru, Ta, NiCr or a combination of these materials however, MRAM material stack is not limited to these materials or to the layers depicted in FIG. 3. The MRAM material stack can be any known stack of materials used in MRAM devices. In various embodiments, the MRAM material stack, as depicted in FIG. 3, resides on dielectric layer 25 and does not include a bottom electrode layer or a bottom electrode for the MRAM device.

Figure 4:
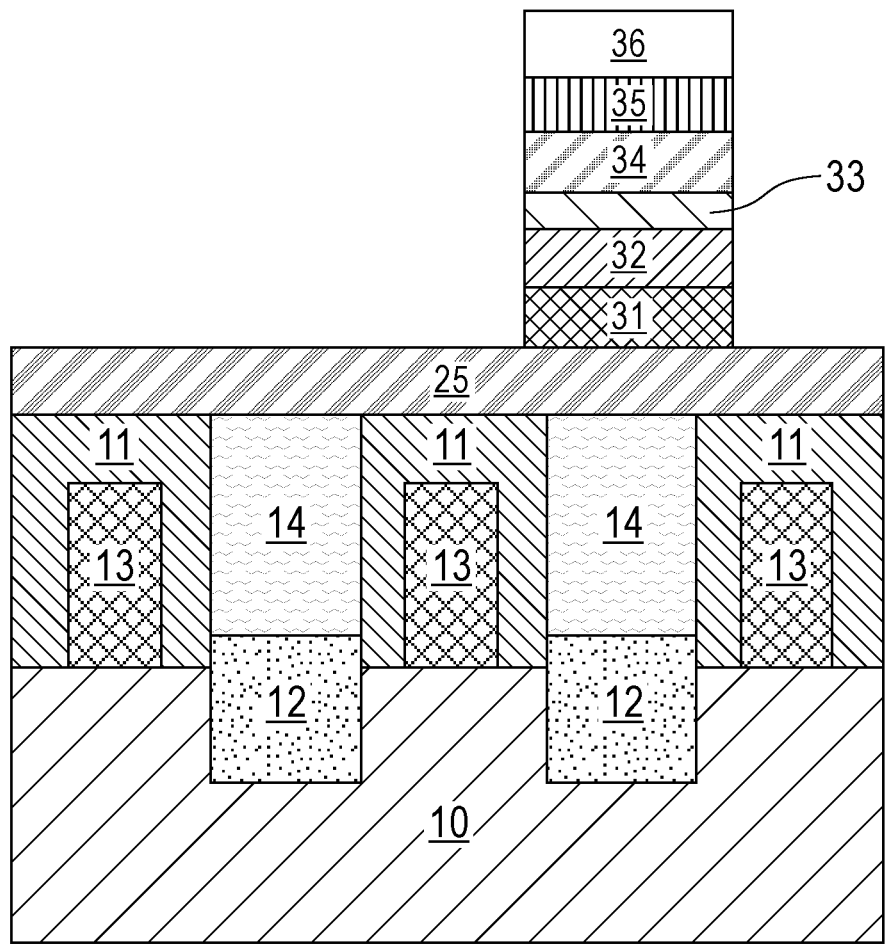
FIG. 4 is a cross-sectional view of the semiconductor structure after forming a magnetoresistive random-access pillar in accordance with an embodiment of the present invention.

FIG. 4 is a cross-sectional view of semiconductor structure 400 after forming an MRAM pillar in accordance with an embodiment of the present invention. As depicted, FIG. 4 includes the elements of FIG. 3 after etching the MRAM material stack in FIG. 3 to form an MRAM pillar composed of portions of the following layers: hardmask 36, top electrode 35, free layer 34, tunneling layer 33, reference layer 32, and metal layer 31. For example, an ion beam etch is used to remove portions of each of the layers (e.g., hardmask 36, top electrode 35, free layer 34, tunneling layer 33, reference layer 32, and metal layer 31) in the MRAM material stack.

In various embodiments, MRAM pillar resides on dielectric layer 25. Since MRAM material stack resides on dielectric layer 25, there is an elimination or reduction of re-sputtering or back sputtering of an electrode metal, such as Ta, from a bottom electrode material during the MRAM material stack etch. For example, etching the MRAM stack on dielectric layer 25 using ion beam etch prevents bottom electrode re-sputtering on the MRAM pillar. As depicted in FIG. 4, a bottom electrode is not present. A reduction of re-sputtering or back-sputtering of bottom electrode metal materials, such as Ta, at MRAM pillar formation improves manufacturability of an MRAM device (e.g., improves process yield at MRAM stack etch). The remaining portions of hardmask 36, top electrode 35, free layer 34, tunneling layer 33, reference layer 32, and metal layer 31 after the etch form the MRAM pillar. In various embodiments, the width of the MRAM pillar is in the range of 10 to 100 nm.

Figure 5:
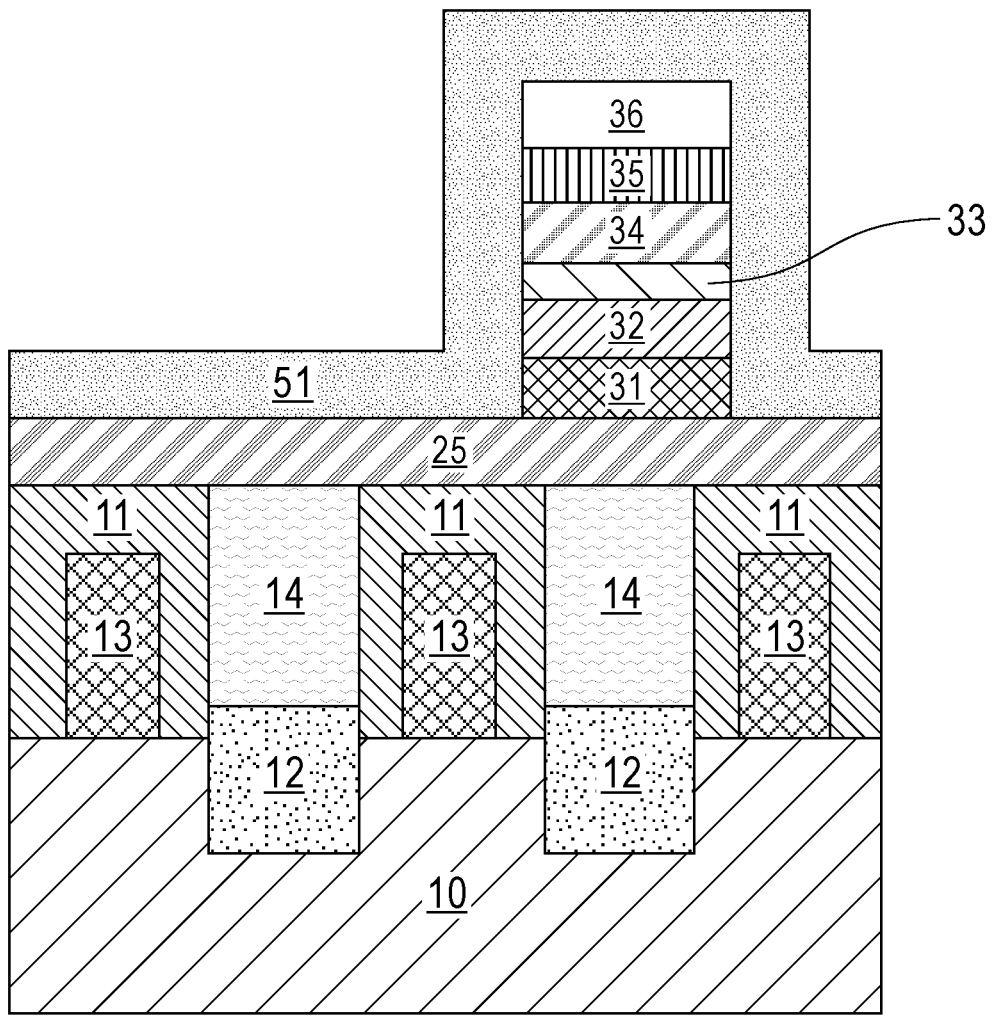
FIG. 5 is a cross-sectional view of the semiconductor structure after forming a protective liner over the semiconductor substructure in accordance with an embodiment of the present invention.

FIG. 5 is a cross-sectional view of semiconductor structure 500 after forming protective liner 51 over semiconductor substructure 500 in accordance with an embodiment of the present invention. A layer of a dielectric material, such as, SiN can be deposited by plasma enhanced chemical vapor deposition (PECVD), atomic layer deposition (ALD), or other known dielectric deposition processes used in semiconductor spacer deposition. In various embodiments, protective liner 51 is composed of SiN, SiO2, or any spacer dielectric material used CMOS devices. A deposition of protective liner 51 occurs over the MRAM pillar and over exposed portions of dielectric layer 25. A thickness of protective liner 51 can be in the range of 5 to 30 nm, however, in some embodiments, protective liner 51 may be thicker than 30 nm depending on MRAM device pitch.

Figure 6:
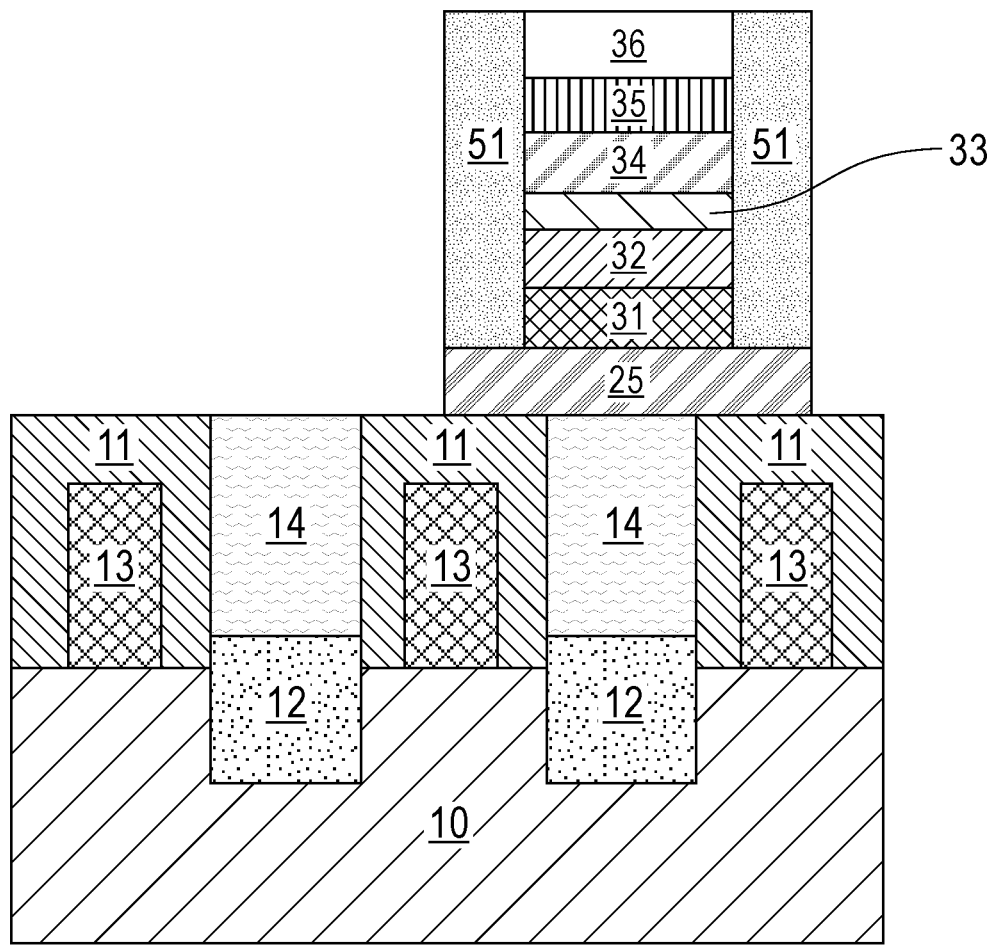
FIG. 6 is a cross-sectional view of the semiconductor structure after removing the protective liner and the layer of dielectric material from exposed top horizontal surfaces of the semiconductor substructure in accordance with an embodiment of the present invention.

FIG. 6 is a cross-sectional view of semiconductor structure 600 after removing protective liner 51 and dielectric layer 25 from exposed horizontal surfaces of semiconductor substructure 600 in accordance with an embodiment of the present invention. In various embodiments. an etch process removes protective liner 51 from the top surface of hardmask 36, from an exposed horizontal top surface of protective liner 51 (e.g., not from the vertical sides of the MRAM pillar), and then. removes a portion of dielectric layer 25, previously under protective liner 51, from exposed top surfaces of S/D contacts 14 and from exposed top surfaces of first dielectric layer 11. For example, protective liner 51 and dielectric layer 25 may be removed using a reactive ion etch (RIE) or other known dielectric material etch process to selective remove dielectric layer 25 and protective liner 51 from horizontal surfaces. Protective liner 51 remains on vertical sides of the MRAM pillar and the portion of dielectric layer 25 remains under the vertical portion of the remaining portion of protective liner 51 and under the remaining portion of dielectric layer 25.

Upon etch completion, the MRAM pillar remains in semiconductor structure 600 with a portion of protective liner 51 on the sides of the MRAM pillar and a portion of dielectric layer 25 remaining under the MRAM pillar and under protective liner 51. Protective liner 51 can be considered an encapsulation of the MRAM pillar or protective cover for the MRAM pillar. A width of the remaining portion of dielectric layer 25 that is under the MRAM pillar is in the range of 10 to 100 nm however, a width of dielectric layer 25 is not limited to this.

Figure 7:
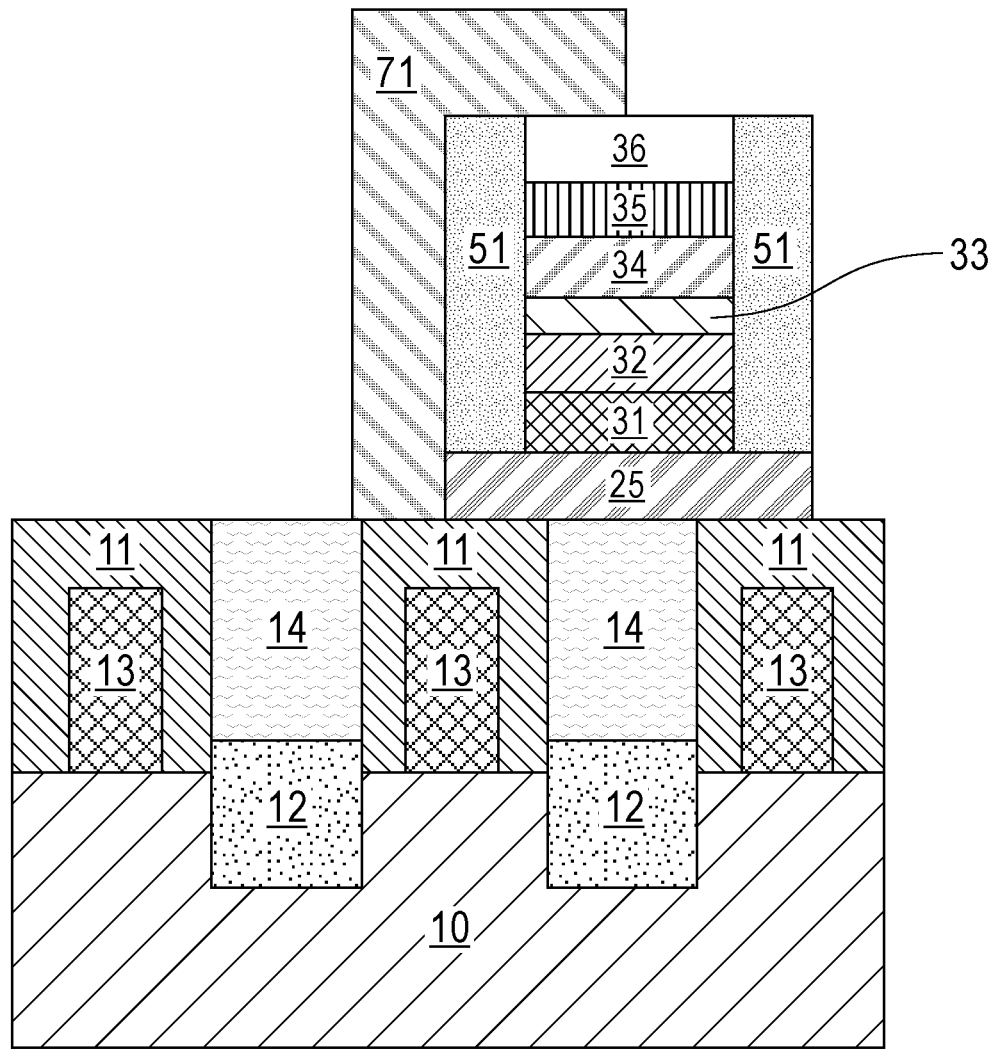
FIG. 7 is a cross-sectional view of the semiconductor structure after depositing and patterning a layer of optical planarization material in accordance with an embodiment of the present invention.

FIG. 7 is a cross-sectional view of semiconductor structure 700 after depositing and patterning a layer of optical planarization material (OPL) 71 in accordance with an embodiment of the present invention. OPL 71 may be any known OPL material used in semiconductor device formation or manufacture. A layer of OPL 71 may be deposited over of semiconductor structure 700 using a spin on coat process, followed by lithograph patterning and etching processes to remove portions of OPL 71 selectively from semiconductor structure 700. The etching process should be selective to OPL 71. As depicted in FIG. 7, OPL 71 may be removed from a portion of hardmask 36, a portion of protective liner 51 covering the sides of the MRAM pillar, a portion of dielectric layer 25, and from exposed surfaces of first dielectric layer 11 and exposed surfaces of S/D contacts 14.

Upon completion of etching of OPL 71, a portion of OPL 71 remains over a side or a portion of the MRAM pillar, on a side or vertical portion of dielectric layer 25, and over a portion of hardmask 36. In various embodiments, an amount of OPL 71 or a portion of OPL 71 remaining is enough to prevent mechanical instability or movement of the MRAM pillar in subsequent processing. In some embodiments, at least one half of OPL 71 on the MRAM pillar remains after etch. In other embodiments, less than half OPL 71 remains after etch. In one embodiment, one half of the MRAM pillar remains covered by OPL 71. The remaining OPL 71 can cover a portion of hardmask 36, a portion of protective liner 51, a portion of dielectric layer 25, a portion of first dielectric layer 11, and in some embodiments, a portion of S/D contacts 14. For example, one half of hardmask 36 is cover by OPL 71.

Figure 8:
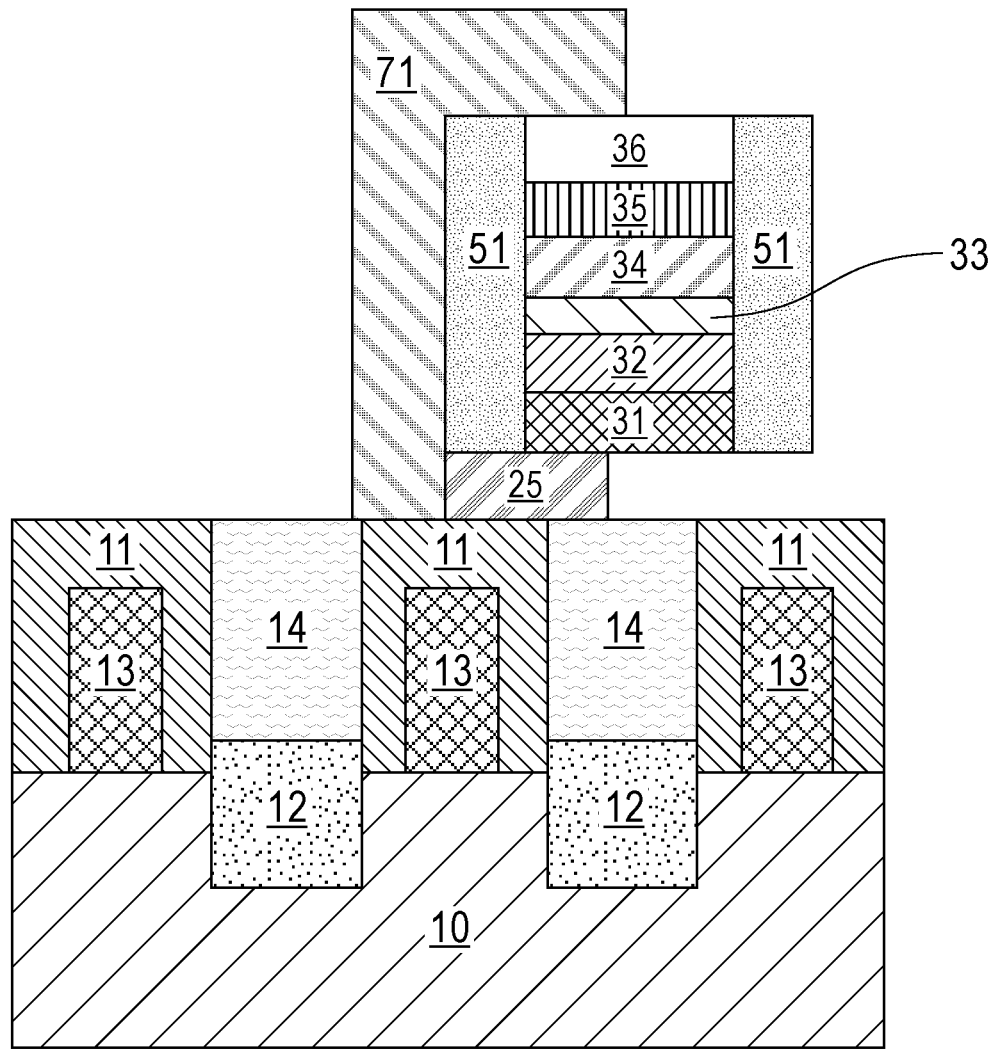
FIG. 8 is a cross-sectional view of the semiconductor structure after selective etch of a portion of the dielectric layer in accordance with an embodiment of the present invention.

FIG. 8 is a cross-sectional view of semiconductor structure 800 after an etch removing of a portion of dielectric layer 25 in accordance with an embodiment of the present invention. In various embodiments, an etch process removes a portion of dielectric layer 25 under a portion of protective liner 51 and under a portion of metal layer 31. For example, after using a buffered hydrofluoric acid (BHF) wet or dry etch or a chemical oxide removal (COR) process to remove a portion of dielectric layer 25 under metal layer 31 and protective liner 51. After etch completion, a portion of dielectric layer 25 over a portion of S/D contact 14 and a portion of first dielectric layer 11 remains. The remaining portion of dielectric layer 25 is under a portion of the MRAM pillar (e.g., under a portion of metal layer 31) and under a portion of protective liner 51. An etch process or an etchant may be selected that does not remove a dielectric material used in protective liner 51. In various embodiments, greater than one half of dielectric layer 25 under MRAM pillar is removed.

In various embodiments, the removed portion of dielectric layer 25 forms a divot or a notch under a portion of metal layer 31. The notch or divot extends horizontally under the MRAM pillar replacing the removed portion of dielectric layer 25 under the MRAM pillar. In various embodiments, the notch or divot extends 10 to 30 nm under the MRAM pillar. In one embodiment, the notch extends 5 nm under the MRAM pillar. For example, a divot or a notch may have a width of 20 nm. In some embodiments, a width of the divot or notch corresponds to or is related to an amount of OPL 71 remaining (e.g., less OPL 71, deeper divot). In one embodiment, a width of the notch is greater than one half of the width of the width of the remaining dielectric layer 25. In some embodiments, the width of the notch is less than one half the width of the remaining dielectric layer 25. In one embodiment, the width of the notch is equal to one half the width of the MRAM pillar diameter, where as depicted in FIG. 8, the MRAM pillar diameter and a width of the notch are in a X-direction (e.g., parallel to surfaces of S/D contact 14 and first dielectric layer 11 of the transistor).

In various embodiments, the divot or notch thickness or height corresponds to a thickness of dielectric layer 25. A thickness of dielectric layer 25 ranges from 5 to 50 um and therefore, in various embodiments, a notch thickness or height is in the range of 5 to 50 nm, however, the thickness can be larger. For example, a divot or notch height can be 10 um. In various embodiments, the divot or notch is not centered under the MRAM pillar but is offset to one side under a portion of metal layer 31.

Figure 9:
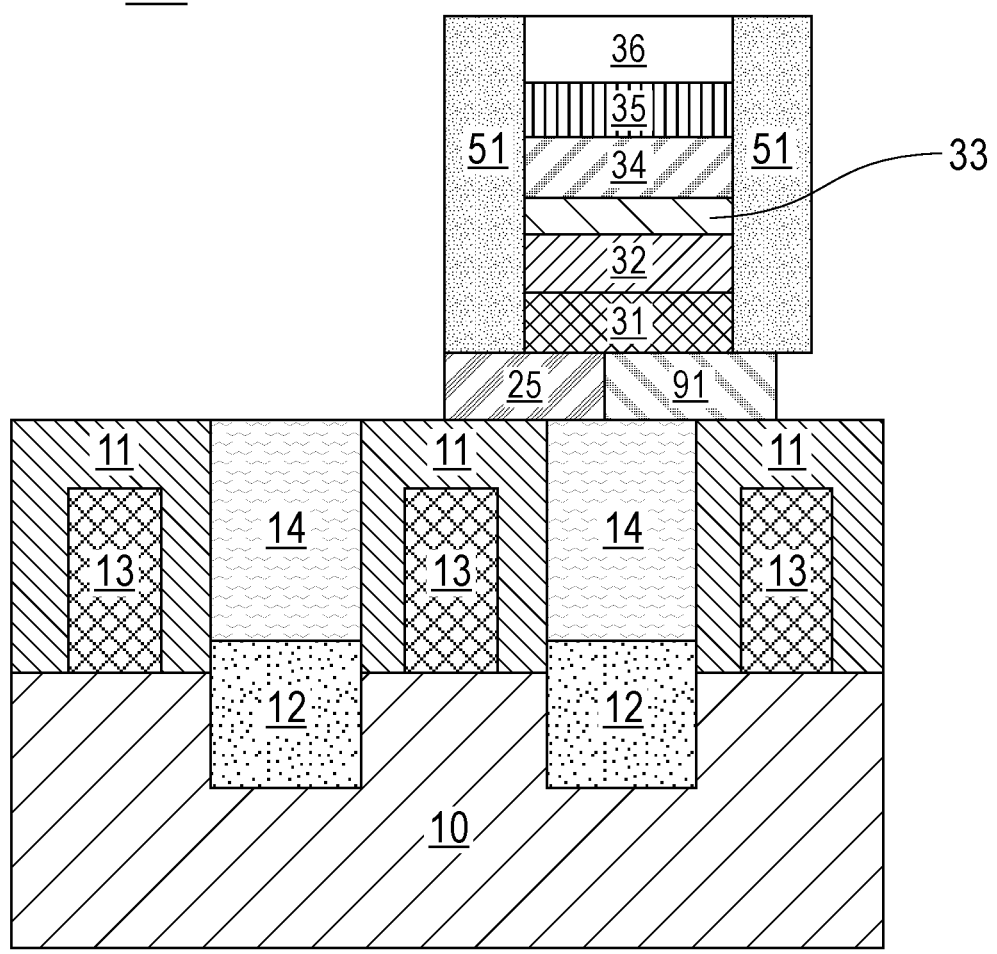
FIG. 9 is a cross-sectional view of the semiconductor structure after a depositing a metal layer and performing an etch of a top surface of the semiconductor structure in accordance with an embodiment of the present invention.

FIG. 9 is a cross-sectional view of semiconductor structure 900 after a depositing bottom electrode 91 and performing an etch of a top surface of semiconductor structure 700 in accordance with an embodiment of the present invention. In various embodiments, a blanket deposition of a metal layer used to form bottom electrode 91 occurs over exposed surfaces of semiconductor structure 700 and inside the divot or notch formed under a portion of metal layer 31. For example, a layer of ruthenium (Ru) may be deposited by ALD or other similar deposition process over the surfaces of semiconductor structure 700 that also fills the divot or notch.

In various embodiments, a etch process, such as a plasma dry etch, occurs removing the portion of bottom electrode 91 from exposed top surfaces of semiconductor structure 900 while a portion of bottom electrode 91 remains under metal layer 31 to form the second electrode (i.e., the bottom electrode) of the MRAM device. As depicted in FIG. 9, most of bottom electrode 91 remains in the divot or notch under a portion of metal layer 31. In various embodiments, a center of bottom electrode 91 is not under a center of the MRAM pillar. In other words, bottom electrode 91 is off-set or off-center from the MRAM pillar forming the MRAM device.

In various embodiments, bottom electrode 91 connects a portion of metal layer 31 in the MRAM device to a portion of S/D contact 14 to the transistor (i.e., to S/D 12). In various embodiments, a width of the connection between bottom electrode 91 and S/D contact 14 is the range of 10 to 30 nm, where the width of the connection may be considered a distance from an outside edge of the MRAM pillar to a farthest point the notch or divot extends radially toward an opposite edge of the MRAM pillar. In some embodiments, one half of the area of metal layer 31 (e.g., one half of the width of the MRAM device) connects to bottom electrode 91. In other cases, more than one half of the area of metal layer 31 connects to bottom electrode 91. The remaining portion of dielectric layer 25 and bottom electrode 91 horizontally abut or are horizontally adjacent to each other under metal layer 31.

In various embodiments, the portion of metal layer remaining in the notch or divot forms bottom electrode 91 to create the MRAM device. In such a manner, an MRAM device with bottom electrode 91 residing on S/D contacts 14 that are over S/D 13 in a CMOS device (e.g., a finFET or vertical field-effect transistor). Forming the MRAM device with bottom electrode 91 on S/D contacts 14 puts the MRAM device in direct contact with the CMOS device or transistor reducing wiring resistance from MRAM device to access the transistor and thereby, improving memory speed. In various embodiments, forming the bottom electrode last under metal layer 31 of the MRAM pillar allows MRAM device formation on a S/D contact of a transistor that is also formed before M1 metal layer deposition (i.e., the MRAM device is under M1 metal layer).

Figure 10:
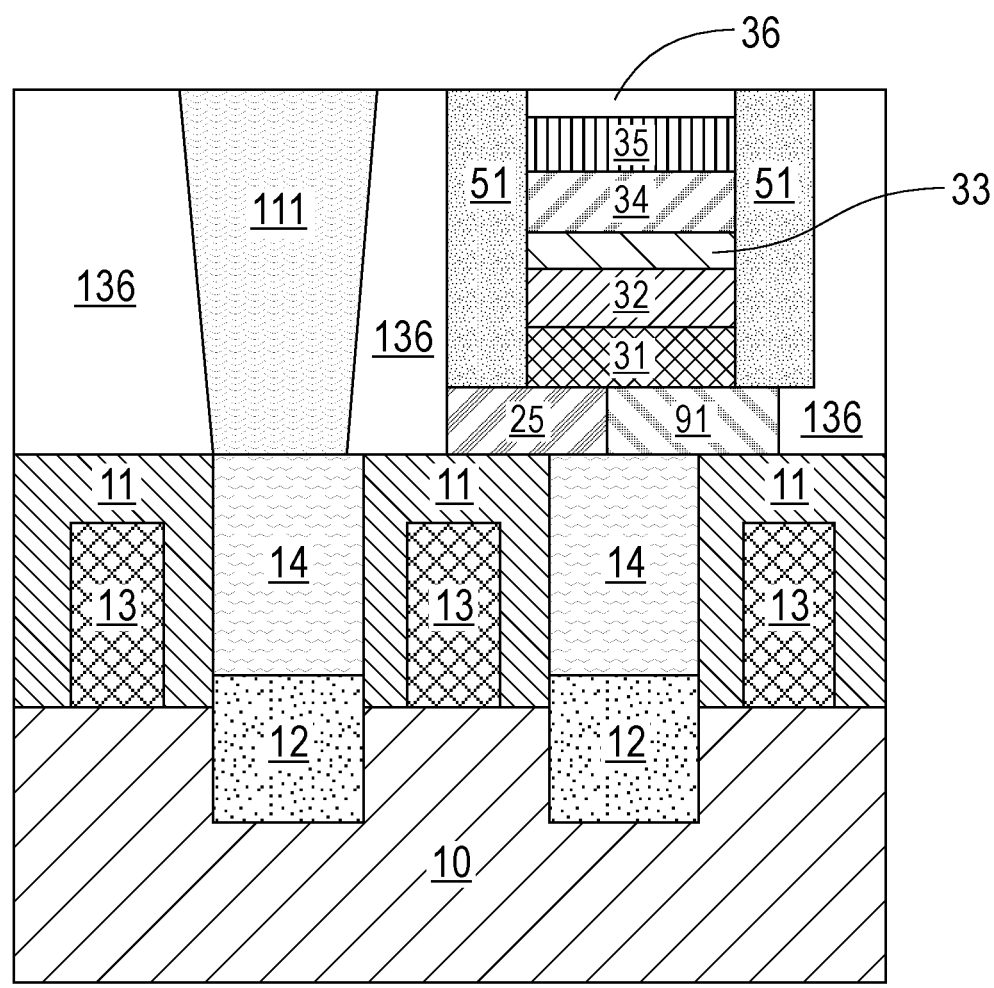
FIG. 10 is a cross-sectional view of the semiconductor structure after depositing interlayer dielectric and forming middle of the line contacts on the semiconductor structure in accordance with an embodiment of the present invention.

FIG. 10 is a cross-sectional view of semiconductor structure 1000 after depositing interlayer dielectric (ILD) 136 and forming contact 111 on semiconductor structure 1000 in accordance with an embodiment of the present invention. Using known middle of the line (MOL) deposition and contact formation processes, a layer of ILD 136 can be deposited over the surface of semiconductor structure 1000 and etched. A layer of a contact material may be deposited over semiconductor structure 1000 and into trenches or openings in ILD 136 to form contact 111. Contact 111 can be formed with any known contact material used in MOL processes. A CMP can be performed, removing the top portions of the contact material, ILD 136, and in some cases, a small portion of hardmask 36 on the MRAM device. Using known methods, contact 111 can be formed on a S/D contacts 14 connecting to S/D 12. In some embodiments, a CMP is performed over a top surface of ILD 136, contacts 111, protective liner 51, and hardmask 36.

In various embodiments, after forming contact 111 in ILD 136, a height of contact 111 is the same as the height of the MRAM device composed of hardmask 36, top electrode 35, free layer 34, tunneling layer 33, reference layer 32, metal layer 31, and bottom electrode 91. As depicted, the MRAM device connects a different contact or S/D contacts 14. In various embodiments, the MRAM device composed of hardmask 36, top electrode 35, free layer 34, tunneling layer 33, reference layer 32, metal layer 31, and with bottom electrode 91 replaces one of a plurality of contacts (e.g., replaces a contact 111) in semiconductor structure 1000. In this way, the MRAM device formed with the processes as depicted and discussed with reference to FIGS. 1-10 connects directly through S/D contacts 14 to S/D 12 on a fin in semiconductor substrate 10 of a CMOS transistor in semiconductor structure 1000 by replacing one of the MOL contacts, such as contact 111, in semiconductor structure 1000. In various embodiments, the MRAM device formed by processes as described with reference to FIGS. 1-10 connects to a transistor without requiring additional MOL wiring and associated electrical resistance of MOL wiring.

By forming the MRAM device using the processes or steps as described with reference to FIGS. 1-10, the semiconductor structure 1000 can provide less resistance in connections between the MRAM device and a transistor (e.g., composed of S/D 12, gate stack 13, S/D contacts 14 in a portion of semiconductor substrate 10) as the MRAM device depicted in FIG. 10 connects to S/D contacts 14 directly over S/D 12 of the transistor thereby reducing the length of the connect between the MRAM device and the transistor.

Figure 11:
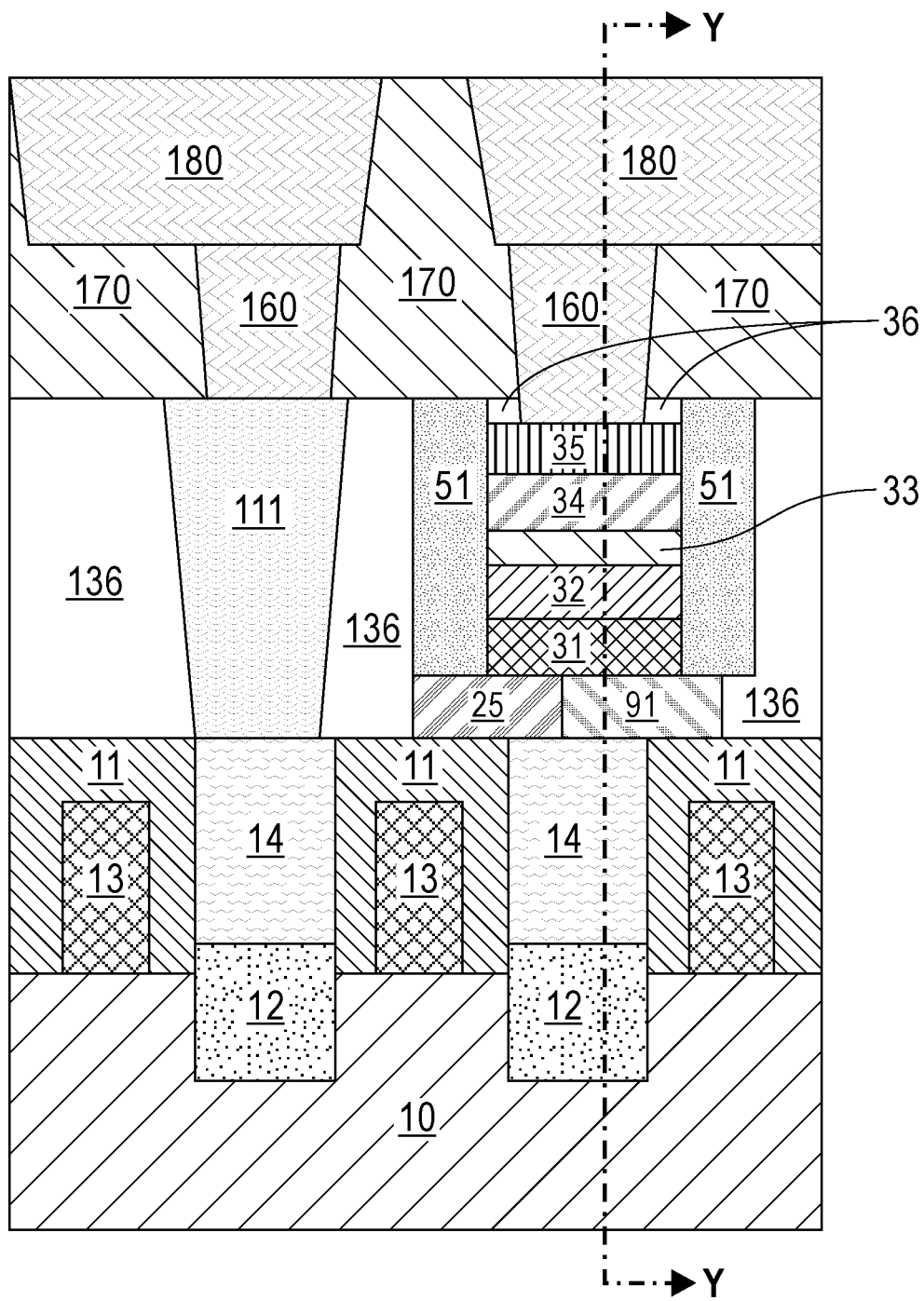
FIG. 11 is a cross-sectional view of the semiconductor structure after forming connections to M1 metal layer in accordance with an embodiment of the present invention.

FIG. 11 is a cross-section of semiconductor structure 1100 after forming vias 160 to M1 metal layer 180 in accordance with an embodiment of the present invention. Using known back end of line (BEOL) processes and materials, including a selective etch of hardmask 36, a plurality of vias 160 are formed in a layer of BEOL ILD 170. For example, the selective etch of a portion of hardmask 36 occurs exposing a portion of top electrode 135 in the MRAM device. Vias 160 can be formed on contact 111 and on the exposed portion of top electrode 35. Another layer of metal, such as copper or cobalt, can be deposited over vias 160 and portions of BEOL ILD 170 to form M1 metal layer 180. In various embodiments, at least one of vias 160 connects the MRAM device through top electrode 35 to M1 metal layer 180 (e.g., the MRAM device is under M1 metal layer 180). As depicted in FIG. 11, the MRAM device resides over the transistor (e.g., gate stack 13, S/D 12, semiconductor substrate 10, and S/D contacts 14) connected to the transistor by bottom electrode 91 formed after MRAM pillar formation. As depicted in FIG. 11, the MRAM device is under M1 metal layer 180. Forming the MRAM device in the middle of the line (MOL) allows both direct connection to the transistor and to M1 metal layer 180 through via 160.

Figure 12:
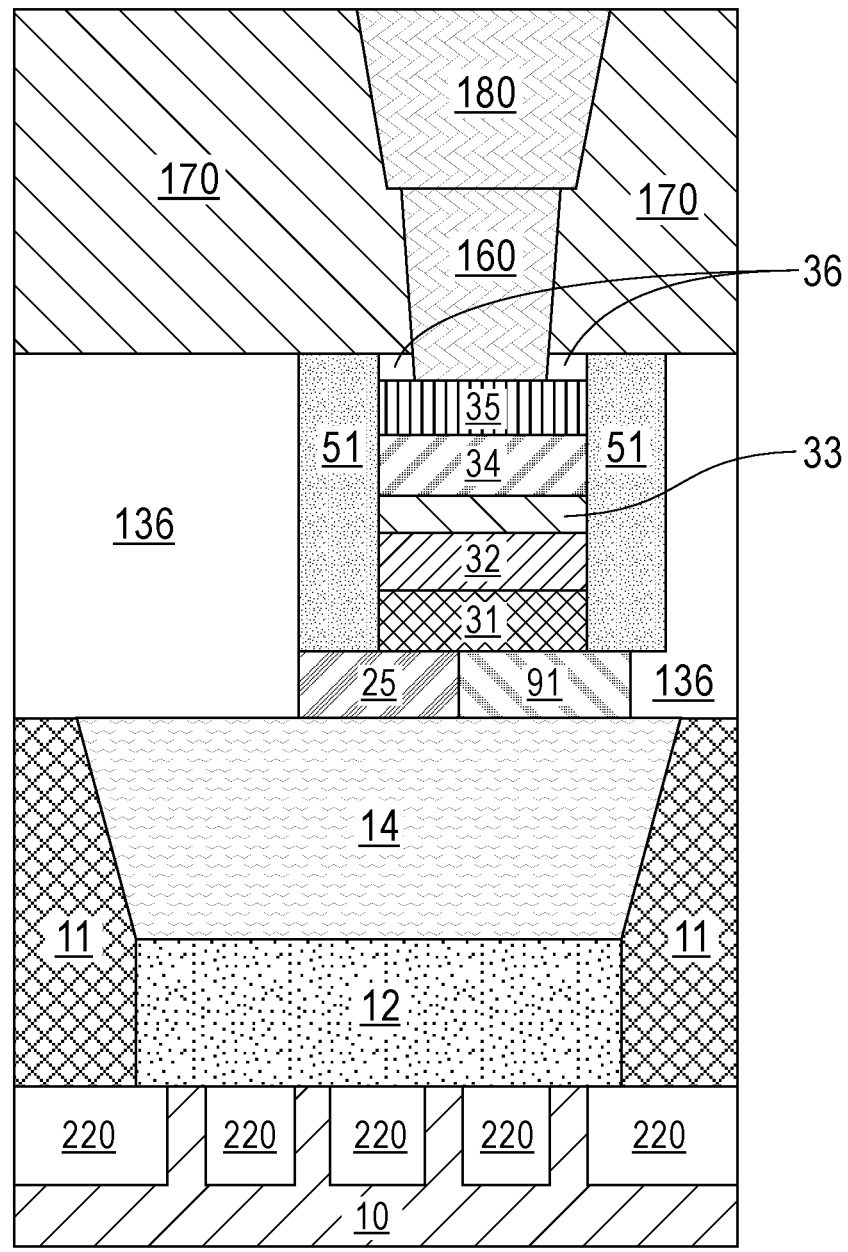
FIG. 12 is a cross-sectional view through Y-Y of the semiconductor structure in FIG. 11 in accordance with an embodiment of the present invention.

FIG. 12 is a cross-sectional view through Y-Y of the semiconductor structure in FIG. 11 in accordance with an embodiment of the present invention. While semiconductor structure 1100 depicts a cross-section of the semiconductor structure 1100 along a fin direction of the transistor, semiconductor structure 1200 is a cross-section of the same semiconductor device but, along a direction perpendicular to a fin direction or in a direction cutting across the fins in semiconductor substrate 10. As depicted, FIG. 12 includes M1 metal layer 180, BEOL ILD 170, vias 160, ILD 136, the MRAM device (e.g., hardmask 36, top electrode 35, free layer 34, tunneling layer 33, reference layer 32, metal layer 31, protective liner 51, and bottom electrode 91), dielectric layer 25, first dielectric layer 11, S/D contacts 14 over S/D 12, gate stack 13, semiconductor substrate 10 and shallow trench isolation (STI) 220, which were not depicted in FIG. 11. The portions of semiconductor substrate 10 extending up between STIs 220 create a plurality of fins.

FIG. 12 illustrates the MRAM device connected by bottom electrode 91 to a transistor by S/D contacts 14 that is directly over S/D 12. In various embodiments, bottom electrode 91 connects a portion of metal layer 31 to a portion of S/D contact 14. The width of bottom electrode 91 connecting to a portion of S/D contact 14 is in the range of 10 to 30 nm. In various embodiments, the connection between the MRAM device and the transistor (e.g., through bottom electrode 91) occurs to one side of the MRAM device (e.g., not in a center portion of the MRAM device). As depicted in FIG. 12, the MRAM device resides below M1 metal layer 180.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a magnetoresistive random-access memory (MRAM) device, comprising:
   depositing a dielectric layer over a top surface of a transistor after a chemical-mechanical polish of the top surface of the transistor;
   depositing a plurality of material layers forming an MRAM material stack over the dielectric layer;
   removing a portion of the MRAM stack to form an MRAM pillar;
   removing an exposed portion of the dielectric layer;
   removing a portion of the dielectric layer under a portion of the MRAM pillar to form a notch under the portion of the MRAM pillar, wherein the portion of the MRAM pillar is above a first source/drain contact;
   depositing an electrode metal over exposed surfaces of the transistor, over the MRAM pillar, and in the notch under the portion of the MRAM pillar; and
   removing the electrode metal from the exposed surfaces of the transistor and from the MRAM pillar, wherein the electrode metal in the notch forms a bottom electrode under the portion of the MRAM pillar forming an MRAM device, wherein the bottom electrode is above the first source/drain contact.

2. The method of forming the MRAM device of claim 1, wherein depositing the dielectric layer over the top surface of the transistor provides the dielectric layer with a thickness in a range of five nanometers to fifty nanometers.

3. The method of forming the MRAM device of claim 1, wherein the notch under the MRAM pillar has a width that is one half of a width of the MRAM pillar.

4. The method of forming the MRAM device of claim 1, wherein the bottom electrode under the portion of the MRAM pillar connects to the first source/drain contact.

5. The method of forming the MRAM device of claim 1, further comprising:
   depositing a first interlayer dielectric material over the transistor and over the MRAM device;
   forming a first contact to a second source/drain contact;
   using a plurality of back-end of line semiconductor processes to form an M1 metal layer connecting to the first contact and to the MRAM device.

6. The method of forming the MRAM device of claim 5, wherein the plurality of back-end of line semiconductor processes, comprises:
   depositing a second interlayer dielectric material over the first interlayer dielectric material, over the first contact to the second source/drain, and over the MRAM device;
   forming a plurality of vias, wherein a first via is over the first contact and a second via is over a portion of a top electrode of the MRAM device;
   depositing the M1 metal layer over the first via, over the second via, and over the second interlayer dielectric material; and
   selectively removing one or more portions of the M1 metal layer.

7. The method of forming the MRAM device of claim 5, wherein the MRAM device is under the M1 metal layer.

8. The method of forming the MRAM device of claim 1, wherein the dielectric layer is composed of one of a silicon carbon material, a silicon oxide material, and silicon carbon oxide material.

9. The method of forming the MRAM device of claim 1, wherein removing the portion of the MRAM stack to form the MRAM pillar, comprises:
   removing the portion of the MRAM material stack using an ion beam etch;
   depositing a layer of a spacer material over exposed surfaces of the dielectric layer and the MRAM pillar; and
   removing a portion of the layer of the spacer material and a portion of the dielectric layer from exposed horizontal surfaces of the transistor and the MRAM pillar.

10. The method of forming the MRAM device of claim 9, wherein removing the portion of the layer of the spacer material and the portion of the dielectric layer from the exposed horizontal surfaces of the transistor and the MRAM pillar, comprises:
    depositing a layer of an optical planarization material over a top surface of a transistor and the MRAM pillar;
    removing a portion of the optical planarization material from a portion of a side of the MRAM pillar, from a portion of a hardmask material on a top surface of the MRAM pillar, and from a portion of top surfaces of the transistor, wherein a portion of the optical planarization material remains on a portion of the spacer material on the MRAM pillar and on a side of a remaining portion of the dielectric layer under the MRAM pillar and the spacer material;
    removing the portion of the dielectric layer under the portion of the MRAM pillar to form the notch under the portion of the MRAM pillar; and
    removing the optical planarization material.

11. The method of forming the MRAM device of claim 9, wherein removing the portion of the MRAM stack to form the MRAM pillar includes using the ion beam etch when the MRAM stack is over a remaining portion of the dielectric layer to reduce back-sputtering on sides of the MRAM pillar.

12. A magnetoresistive random-access memory (MRAM) device, comprising:
    a first source/drain contact in a transistor in a semiconductor substrate, wherein the source/drain contact is over a source/drain in the transistor and is surrounded by a first dielectric material;
    a portion of the first source/drain contact connecting to a portion of a bottom electrode of an MRAM pillar forming an MRAM device, wherein a center of the portion of the bottom electrode is not under a center of the MRAM pillar; and
    a portion of a top electrode in the MRAM pillar in the MRAM device connects to a via, wherein the top electrode in the MRAM pillar forming the MRAM device is under a M1 metal layer.

13. The MRAM device of claim 12, wherein the MRAM device connecting to the via is under the M1 metal layer and above the portion of the source/drain contact connecting to the portion of a bottom electrode.

14. The MRAM device of claim 12, wherein the bottom electrode of the MRAM device is off-set from the center of the MRAM pillar forming the MRAM device.

15. The MRAM device of claim 12, wherein the portion of a bottom electrode of an MRAM device connecting to the first source/drain contact has a width in a range of 10 to 30 nm.

16. The MRAM device of claim 12, wherein the bottom electrode of the MRAM device is composed of one or more of ruthenium and nickel chrome.

17. The MRAM device of claim 12, wherein the bottom electrode of the MRAM device horizontally abuts a portion of a dielectric layer under a portion of the MRAM device.

18. The MRAM device of claim 12, wherein a thickness of the bottom electrode of the MRAM device is in a range of five to fifty nanometers.

19. The MRAM device of claim 12, wherein the transistor is metal-oxide semiconductor field-effect transistor.

20. The MRAM device of claim 12, wherein the MRAM pillar forming the MRAM device includes at least a hardmask, a top electrode, a free layer, a tunneling layer, a reference layer, and a metal layer.

* * * * *